United States Patent [19]

McClellan et al.

[11] Patent Number: 4,630,014

[45] Date of Patent: Dec. 16, 1986

[54] CURRENT LIMITING CIRCUIT BREAKER STATIONARY CONTACT ASSEMBLY WITH INTEGRAL MAGNETIC ACTIVATING MEANS

[75] Inventors: David P. McClellan, Snellville, Ga.; John M. Brown, Jr., Westminster, Md.; Robert E. Black, Ellenwood, Ga.

[73] Assignee: Siemens Energy & Automation, Inc., Atlanta, Ga.

[21] Appl. No.: 718,693

[22] Filed: Apr. 1, 1985

[51] Int. Cl.⁴ .................................................. H03J 3/04

[52] U.S. Cl. ........................................ 335/16; 335/195

[58] Field of Search .......................... 335/16, 147, 195; 200/147 R, 147 A, 147 B

[56] References Cited

U.S. PATENT DOCUMENTS

| | | | |
|---|---|---|---|
| 3,575,676 | 4/1971 | Beaudoin et al. | 335/16 |
| 3,575,680 | 4/1971 | Beaudoin et al. | 335/201 |
| 3,588,761 | 6/1971 | Heft et al. | 335/16 |
| 3,588,762 | 6/1971 | Willard | 335/16 |
| 3,991,391 | 11/1976 | Wafer | 335/16 |
| 4,001,738 | 1/1977 | Terracol et al. | 335/16 |
| 4,118,681 | 10/1978 | Nebon et al. | 335/195 |
| 4,132,968 | 1/1979 | Lang | 335/16 |
| 4,409,573 | 10/1983 | DiMarco et al. | 335/16 |
| 4,458,224 | 7/1984 | Kralik et al. | 335/16 |

OTHER PUBLICATIONS

Advertising brochure by Merlin Gerin "Compact C125, CV60 Breaking Technique and Current Limitation."

*Primary Examiner*—L. T. Hix
*Assistant Examiner*—Brian W. Brown
*Attorney, Agent, or Firm*—F. W. Powers; J. L. James

[57] ABSTRACT

A stationary contact assembly is provided for a current limiting circuit breaker. The contact assembly includes a curved input arm which has a contact fastened thereon and a generally straight output arm which also has a contact fastened thereon and which has an opening for receiving the contact end of the input arm. The contacts are encapsulated in an insulating material which separates the contact arms from each other. A magnetic element is also embedded in the encapsulation material between the input and output contact arms. As current flows through the contact arms, a field is developed about the magnetic element which draws in an armature which reduces the opening force of the contacts.

16 Claims, 11 Drawing Figures

CURRENT LIMITING CIRCUIT BREAKER STATIONARY CONTACT ASSEMBLY WITH INTEGRAL MAGNETIC ACTIVATING MEANS

CROSS-REFERENCE TO RELATED APPLICATIONS

This application is related to application Ser. No. 718,692 filed Apr. 1, 1985 "Cam Following Bridge Contact Carrier For A Current Limiting Circuit Breaker", David P. McClellan, John M. Brown and Gustave E. Heberlein.

BACKGROUND OF THE INVENTION

This invention relates generally to a current limiting circuit breaker and more particularly to a stationary contact assembly for a current limiting circuit breaker.

The interrupting rating of a circuit breaker can be economically increased by using a current limiting set of contacts which may be added onto an existing breaker or integrally formed in a breaker. The current limiting contacts limit the amount of current available to the breaker to a preselected maximum amount which enables the breaker to be designed to interrupt that maximum amount rather than an unlimited amount from a source capable of generating extremely high short circuit currents. Typically, current limiting circuit breakers operate on an electromagnetic repulsion principle wherein as the magnitude of the fault current increases to a preselected magnitude, the magnetic forces build which tend to repel the movable contact away from the stationary contact thereby interrupting the circuit. In the design of current limiting contacts, it is important that when the contacts are closed there is sufficient contact pressure to assure minimal resistance to current flow but that the means for ensuring the requisite contact pressure does not inhibit the fast operation under fault conditions.

U.S. Pat. No. 4,409,573, which issued on Oct. 11, 1983 to Bernard DiMarco and Andrew J. Kralik, discloses a circuit breaker with a current limiting feature provided. The current limiting contacts blow open in response to fault current and are latched in the open position. The breaker is then reset by use of the operating handle. While this breaker achieves a current limiting effect, a higher current rating can be achieved by using blow open contacts of the current limiting type in series with this breaker. This configuration is disclosed in U.S. Pat. No. 4,458,224, which issued on July 3, 1984 to Bernard DiMarco and Andrew J. Kralik. In this embodiment, current limiting blow open contacts are placed in series with the circuit breaker. The blow open contacts are configured to reclose automatically by the action of biasing springs which also function to give the required closed contact pressure. It is apparent that the blow open force is a function of the current magnitude and the length of the parallel conducting paths which create the blow open force. The blow open force in this configuration is thus limited by the physical requirements of the circuit breaker enclosure. Accordingly, it would be appreciated that it would be highly desirable to provide increased blow open force for more rapid separation of the contacts due to a fault without increasing the physical dimensions of the circuit breaker enclosure.

U.S. Pat. No. 3,991,391, which issued on Nov. 9, 1976 to John A. Wafer, and U.S. Pat. No. 4,132,968, which issued on Jan. 2, 1979 to Walter W. Lane, disclose a current limiting circuit breaker which has a slot motor magnetic drive device. In this construction, the threshold level of overload current which produces current limiting action is raised, while the degree of current limiting action during high overload currents is maintained by placing a thin saturable magnetic steel plate across the open end of the slot motor magnetic drive device. During over current conditions below the threshold value, the plate shunts most of the magnetic flux and prevents production of magnetodynamic force upon the contact arm. Above the threshold level, the over current generates magnetic flux sufficient to saturate the plate and force additional flux into the air gap where the flux interacts with the contact arm to drive the contact arm into the slot and produce current limiting action in a normal manner. This configuration changes the normal response to a low level fault which the normal circuit breaker mechanism can handle and thereby limits the over current response of the current limiting contacts.

U.S. Pat. No. 4,001,738, which issued Jan. 4, 1977, to Claude Terracol and Pierre Schueller, discloses a circuit interrupter having an electromagnetic repulsion device. In this configuration, a circuit interrupter has a magnetic circuit energized by the current flowing through the interrupter and an induction plate that is movable with the movable contact of the interrupter. The abrupt rising of a fault current induces secondary currents in the induction plate which is located in the air gap of the magnetic circuit as long as the interrupter is in the closed circuit position. The secondary currents tend to expel the induction plate from the air gap thereby moving the movable contact vigorously away from the magnetic circuit. This increases the repulsing forces for a given current thereby ensuring fast opening operation. An alternate embodiment discloses contacts which form a two-loop current path. That is, a path in which current enters one conductor, flowing in a first direction, then flows through the movable contact in the opposite direction and then flows through the second stationary conductor in the first direction. This two-loop configuration effectively doubles the magnetic repulsion force. U.S. Pat. No. 4,118,681, which issued Oct. 3, 1978 to Jean Pierre Nebon and Robert Morel also discloses a circuit breaker having a two-loop blow off configuration. This patent also discloses a retarding member which is mechanically linked to the movable contact assembly to delay the reclosing of the contact and to prevent a reclosing before tripping of the circuit breaker. While the circuit breakers disclosed offer fast operation in response to a high level fault condition, there is still needed a circuit breaker which opens quickly and cleanly in response to a low level fault condition. Accordingly, it will be appreciated that it would be highly desirable to provide a circuit breaker contact structure which facilitates a fast response to low level fault conditions.

It will now be understood that it would be highly desirable to provide a current limiting circuit breaker which develops the maximum magnetic repulsive forces in a small amount of space and which opens and closes cleanly without undue hesitation.

It is an object of the present invention to provide a stationary contact assembly with a means to repel the movable contact assembly with double the normal blow-off force.

Still another object of the present invention is to provide a stationary contact assembly which is very compact yet which is not hindered by electrical interaction among the parts.

SUMMARY OF THE INVENTION

In one aspect of the invention, a current limiting circuit breaker has a stationary contact assembly and a movable contact assembly and an armature assembly. The stationary contact assembly has a magnetic element incorporated therein which, in response to fault current of a predetermined magnitude, attracts the armature of the armature assembly thereby causing the movable contact assembly to move from a closed position to an open position.

In another asepct of the invention, a first elongated contact arm has a first contact thereon and an opening therein. A second elongated contact arm has a second contact thereon and protrudes through the opening in the first contact arm thereby aligning the contacts. The contact arms are encapsulated in insulative material with the ends of the contact arms protruding through the encapsulation material. A magnetic element is encapsulated in the insulative material with its ends protruding therefrom and is positioned below the contacts between the first and second contact arms.

As current flows through one stationary contact arm through the movable contact and through the other stationary contact arm, a two-loop current path is created which creates a double magnetic blow open force. As current flows, the magnetic element attracts the armature so that the force required to blow open the contacts is reduced. This allows fast operation in response to a low level fault current.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

DESCRIPTION OF THE PREFERRED EMBODIMENTS

Figure 1:
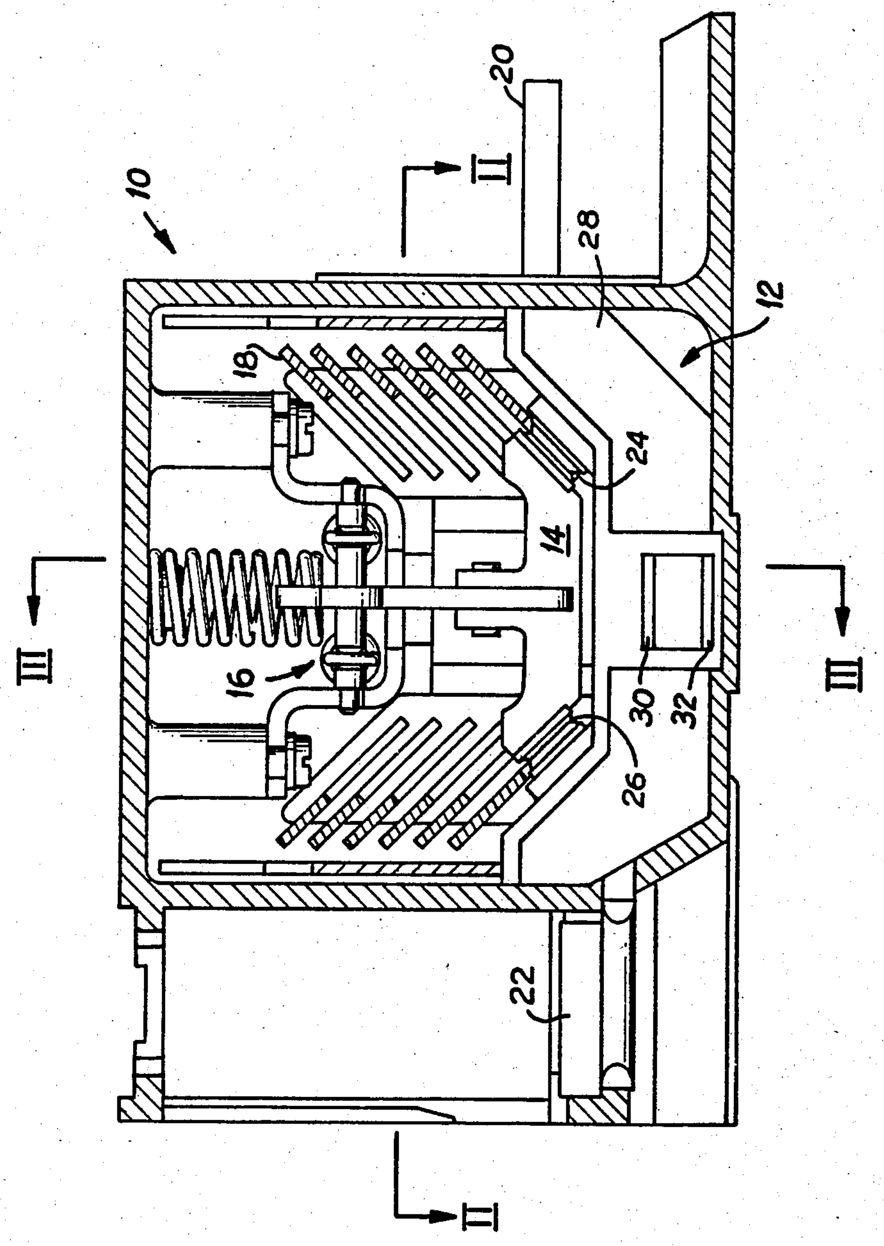
FIG. 1 is a diagrammatic view of the current limiting contacts of a current limiting circuit breaker assembly and is a longitudinal cross-sectional view of the circuit breaker.
Figure 2:
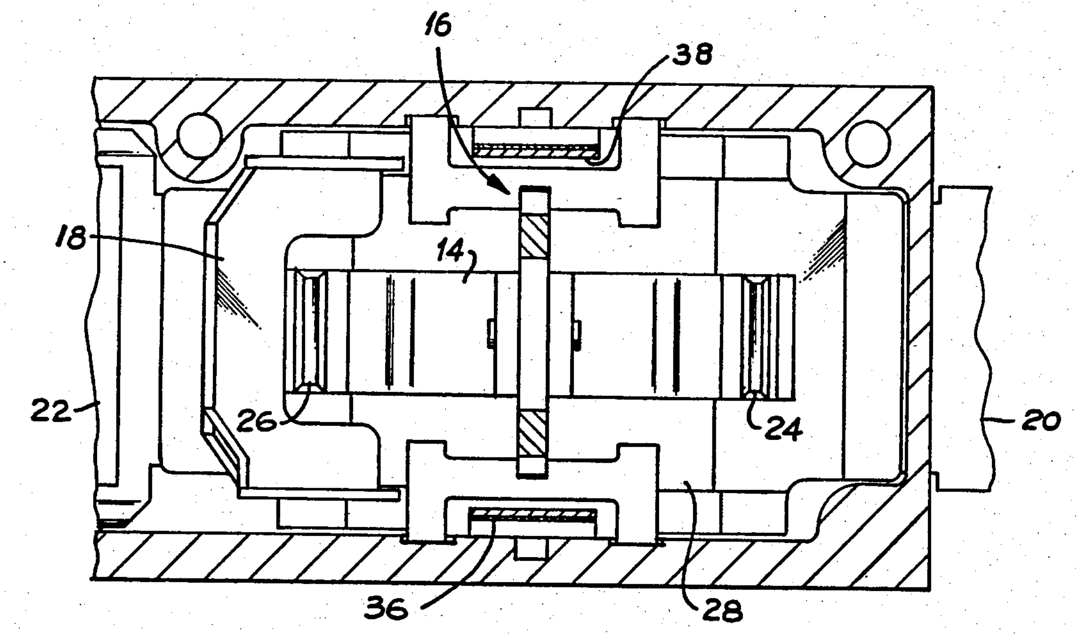
FIG. 2 is a longitudinal cross-sectional view generally taken along line II—II of FIG. 1 illustrating certain components which are described in detail in the specification.
Figure 3:
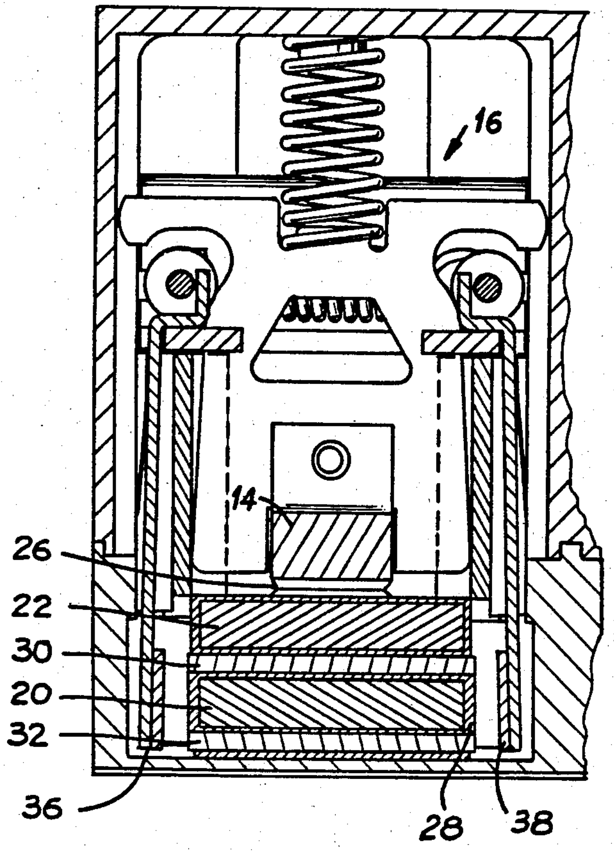
FIG. 3 is a diagrammatic view taken generally along line III—III of FIG. 1 illustrating other components which are described in detail in the specification.
Figure 4:
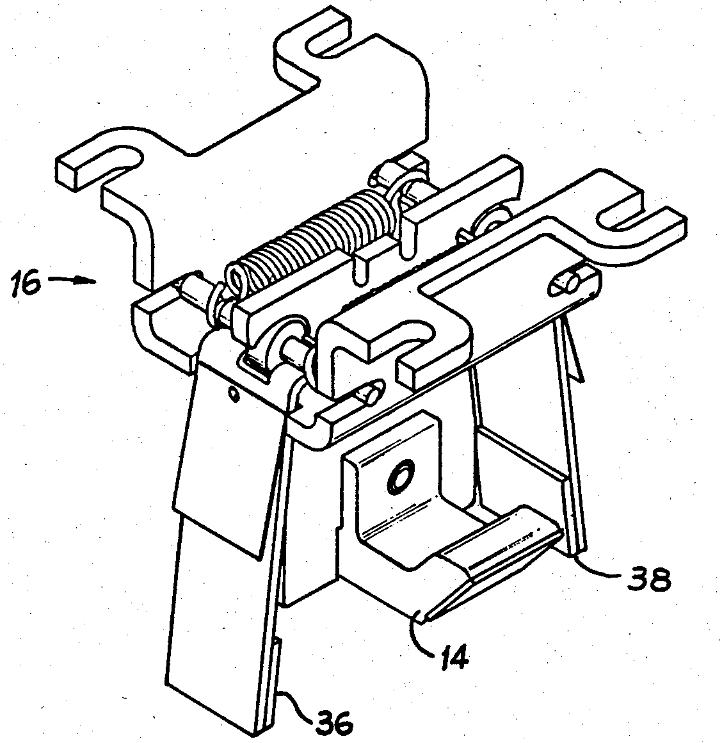
FIG. 4 is an isometric view of the contact carrier assembly.
Figure 5:
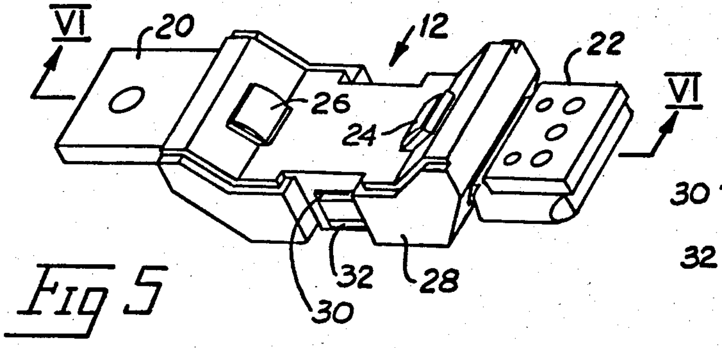
FIG. 5 is an isometric view of the stationary contact assembly.
Figure 7:
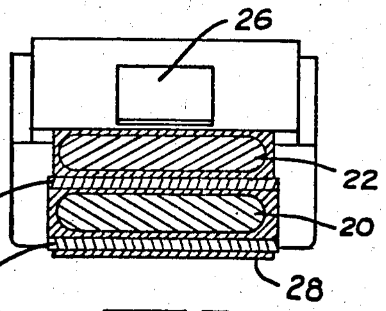
FIG. 7 is a cross-sectional view taken along line VII—VII of FIG. 6.
Figure 6:
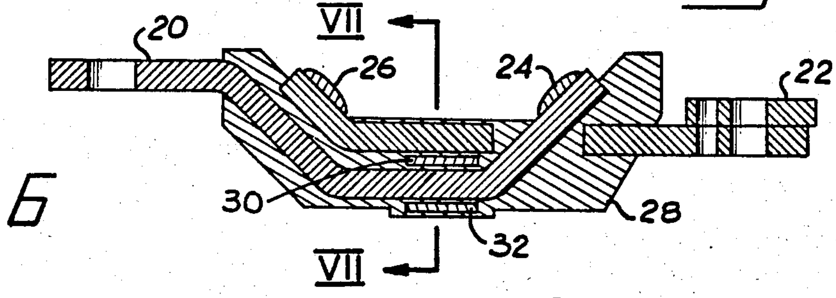
FIG. 6 is a longitudinal cross-sectional view of the stationary contact assembly taken along line VI—VI of FIG. 5.

Referring to FIG. 1, a current limiting circuit breaker 10 is shown which may be integrally formed with a circuit breaker or may comprise an add-on unit for an existing circuit breaker to increase the current interrupting rating of the circuit breaker. The current limiting circuit breaker 10 includes a stationary contact assembly 12, a movable contact bridge assembly 14 and a carrier assembly 16. An arc chute 18 is provided for quenching the arc as is well known in the art. The carrier assembly 16 exerts a closing force upon the contact bridge 14 which urges the movable and stationary contacts to the closed position at which the contacts abut one another. In response to a low level fault, the armatures 36 and 38 reduce the closing biasing force of the carrier assembly 16 on the contact bridge allowing the contacts to quickly and cleanly open in response to the low level fault. During a high level fault, the magnetic repulsion is sufficient to blow the contacts open. As the contacts open, the arc chute 18 draws out the arc and extinguishes the arc.

Referring to FIGS. 5–11, the stationary contact assembly 12 includes an input arm 20, an output arm 22, an input contact 24 attached to the end of the input arm 20, and an output contact 26 attached to the end of the output arm 22. The input and output arms are encapsulated in an encapsulation material 28 which electrically insulates the contact arms one from the other. Also embedded in the encapsulation material is a first magnetic element 30 and a second magnetic element 32 which are insulated by the encapsulation material from each other and from each of the contact arms. The first magnetic element 30 is preferrably placed between the input and output contact arms and is centrally located so that it is between input and output contacts 24, 26 which are exposed for making proper contact with the bridge contact assembly 14. An edge or face of the magnetic element protrudes from the encapsulation material. Where the second magnetic element 32 is used, it is preferably located beneath the input contact arm 20. This places the second magnetic element at the bottom of the stationary contact structure 12.

Figure 8:
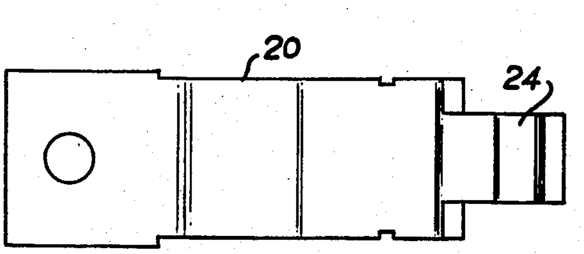
FIG. 8 is a top view of the input terminal of the stationary contact assembly.
Figure 9:
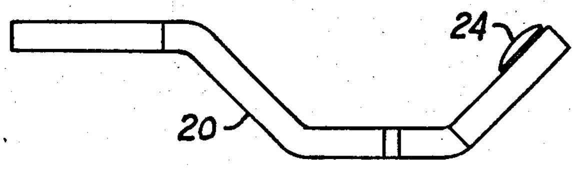
FIG. 9 is a side view of the stationary contact of FIG. 8.

Referring to FIGS. 8 and 9, the output contact arm 22 has an opening 34 of a size sufficient for receiving a portion of the input arm 20. The output contact 26 is affixed to one end of the contact arm 22 and the other end of the contact arm is configured for connection to the circuit breaker by means of flexible conductors or other means. The end of the output contact arm 22 which has the output contact 26 affixed thereon extends angularly upward from the contact arm. By this construction, the contact 26 is exposed when installed in the contact assembly 12 and surrounded by the encapsulation material 28.

Figure 10:
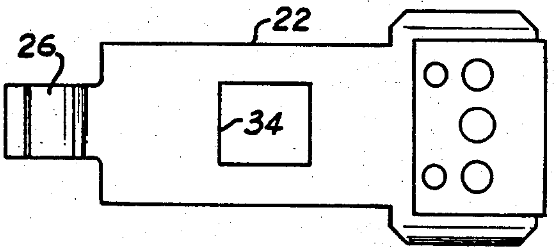
FIG. 10 is top view of the output terminal of the stationary contact assembly.
Figure 11:
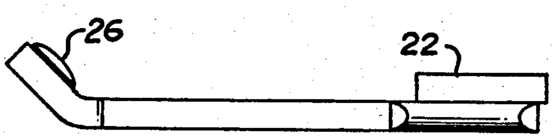
FIG. 11 is a side view of the stationary contact of FIG. 10.

Referring to FIGS. 10 and 11, the input arm 20 has the input contact 24 affixed to one end thereof. The other end of the contact arm is adapted for connection to an incoming line. The input contact arm is shaped from a flat piece of metal which has three bends therein. The first bend extends downward from the horizontal, the second bend returns the metal to the horizontal position and the third bend extends the metal angularly upward so that the contact 24 is approximately on the same horizontal plane as the terminal portion of the contact arm 20. The three bends divide the contact arm 20 into two portions, a horizontal terminal portion and a general U-shaped portion which has the contact 24 affixed to one leg of the U. The portion of the contact arm 20 which contains the contact 24 has a narrower configuration than the remainder of the contact. By this construction, the narrow portion of the contact arm 20 can be installed through the opening 34 of the output contact arm 22. This allows both contacts 24 and 26 to exist on the same horizontal plane. By this construction there is created a dual path wherein current entering the input arm 20 traverses the input arm to contact 24 and goes from contact 24 through the contact bridge assembly and returns through contact 26 to the output arm 22 and onto the main circuit breaker. The current flow in the input contact arm is to the right as viewed in the drawings and the current flow in the output contact arm 22 is also to the right while the current flow in the contact bridge is in the opposite direction. Therefore, the current in each of the arms produces a magnetic blow-off force. The combined blow-off force then is twice the normal blow-off force for a given current. As current flows through the contact arms 20 and 22, a magnetic field is created about the magnetic elements 30 and 32.

While operation of the preferred embodiment of the present invention is believed to be clearly apparent from the foregoing description, further amplification will be made in the following summary of such operation.

In operation, incoming current from the line is received by the first or input stationary contact arm from which point it travels around the generally U-shaped configuration of a contact arm to the contact attached thereto. From the contact affixed to the first stationary contact arm, current flows through the movable contact bridge and to the contact affixed to the second stationary contact arm and then through the second stationary contact arm to the main breaker. As described above, the contact arms are embedded in a parallel fashion to one another so that the current flowing therein flows in generally parallel paths and because the current comes in on one terminal and loops through the movable contact bridge to the other terminal, the current flow in the encapsulated material for each of the stationary contact arms is in the same direction. This dual current flow in one direction creates a magnetic blow-off force which has twice the strength that would be found due to the normal current flow which is only half as much. This dual magnetic field creates a strong blow open force which tends to move the stationary contact bridge towards the open position. A sufficiently strong fault will cause immediate blow-off of the contacts without additional help required from from the magnets. However, where the fault current is not sufficiently strong to immediately blow open the contacts, the magnetic field created by the magnets immediately attracts the armatures which reduces the biasing force of the carrier assembly and the required force to blow open the contacts.

It will now be understood that there has been disclosed an improved stationary contact assembly for a current limiting circuit breaker which is compact and which has increased magnetic blow open force. The stationary contact assembly makes very efficient use of space and can easily be configured and adapted to a variety fo circuit breakers.

As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured by Letters Patent of the United States is:

1. A current limiting circuit breaker, comprising:

a stationary contact assembly having first and second contact arms electrically insulated one from the other and a magnetic element which creates a magnetic field in response to current flow thorugh said contact arm;

a movable contact assembly controllably movable between an open position at which the contact assemblies are spaced one from the other a preselected distance and a closed position at which the contact assemblies abut one another creating a path for current to flow from the first stationary contact arm in a first direction to the movable contact assembly in a second, opposite direction and through the second stationary contact in the first direction creating a two-loop current path which produces two magnetic blow open forces from a single current; and an armature assembly connected to the movable contact assembly and having an armature arm extending from the armature assembly in the vicinity of the magnetic element, said magnetic element attracting said armature arm in response to current flow of a preselected magnitude through said stationary contact assembly thereby decreasing the magnetic blow open force required to move the movable contact assembly from the closed position to the open position.

2. A current limiting circuit breaker according to claim 1, wherein the current flowing in the stationary contact arms and in the movable contact assembly flow in generally parallel directions.

3. A current limiting circuit breaker according to claim 1, wherein the current flowing in the first and second stationary contact arms and the movable contact assembly creates a blow open force which is substantially double the normal blow open force for current flow of a given magnitude.

4. A current limiting circuit breaker according to claim 1, wherein the first and second stationary contact arms are encapsulated in an insulative material.

5. A current limiting circuit breaker according to claim 1, wherein the magnetic element is positioned between the first and second stationary contact arms.

6. A current limiting circuit breaker according to claim 4, wherein the magnetic element is positioned between the first and second stationary contact arms and partially embedded in the encapsulation material.

7. A current limiting circuit breaker according to claim 6, including a second magnetic element partially embedded in the encapsulation material and spaced from the first magnetic element.

8. A current limiting circuit breaker, according to claim 7, wherein one of the first and second stationary contact arms is positioned between the first and second magnetic elements.

9. A current limiting circuit breaker according to claim 1, wherein the second stationary contact arm has an opening therethrough and wherein the first stationary contact arm is configured to protrude through the opening.

10. A current limiting circuit breaker according to claim 9, wherein each of the first and second stationary contact arms have a contact pad connected to the contact arm and positioned for abutting engagement with the movable contact assembly.

11. A current limiting circuit breaker according to claim 10, wherein the first and second contact arms are encapsulated in an insulative material and wherein the contact pads are exposed for making contact with the movable contact assembly.

12. A current limiting circuit breaker according to claim 11, wherein the encapsulation material is glass reinforced polyester.

13. A current limiting circuit breaker according to claim 11, including a magnetic element positioned between the first and second stationary contact arms and insulated therefrom by the encapsulation material and having a face protruding through the encapsulation material.

14. A current limiting circuit breaker according to claim 13, including a second magnetic element spaced from the first magnetic element and insulated therefrom by the encapsulation material, one of said first and second stationary contact arms being positioned between the first and second magnetic elements.

15. A current limiting circuit breaker according to claim 1, wherein the second stationary contact arm has an opening therethrough and has a contact positioned thereon and wherein the first stationary contact arm protrudes through the opening in the second contact arm and has a contact positioned thereon and including first and second magnetic elements positioned between the contacts with the first magnetic element being positioned between the first and second stationary contact arms and with the first stationary contact arm being positioned between the first and second magnetic elements, the magnetic elements and the contact arms being insulated one from the other by an encapsulation material configured so that the stationary contact assembly has an elongate configuration with an extended portion of the first stationary contact arm protruding from one end of the encapsulated material and an extended portion of the second stationary contact arm protruding from the encapsulated material at the other end and wherein the magnetic elements protrude from the encapsulation material along the sides of the configuration, said magnetic elements being exposed for creating a magnetic field which attracts the armature arm of the armature assembly.

16. A stationary contact assembly for a current limiting circuit breaker, comprising:

a first elongated contact arm having a contact thereon;

a second elongated contact arm having a contact thereon and an opening therein, said first contact arm protruding through the second contact arm opening, thereby aligning the contacts, said contact arms being encapsulated in an insulative material with the first contact arm protruding from one end and the second contact arm protruding from the other end and with the first and second contacts protruding therefrom intermediate the ends thereof;

a first magnetic element encapsulated in the insulative material with its ends protruding therefrom and being positioned below the contacts betwen the first and second contact arms, said insulative material insulating the first and second contact arms from one another and from the magnetic element; and a second magnetic element encapsulated in the insulative material with its ends protruding therefrom and being aligned with the first magnetic element and spaced therefrom.

* * * * *